(12) United States Patent
Nguyen (10) Patent No.: US 6,262,932 B1
(45) Date of Patent: Jul. 17, 2001

(54) RAM CELLS HAVING A SUBSTANTIALLY BALANCED NUMBER OF N-MOS AND P-MOS TRANSISTORS FOR IMPROVING LAYOUT AREAS

(75) Inventor: Huy Nguyen, Fremont, CA (US)

(73) Assignee: Rosun Technologies, Fremont, CA (US)

( * ) Notice: Subject to any disclaimer, the term of this patent is extended or adjusted under 35 U.S.C. 154(b) by 0 days.

(21) Appl. No.: 09/397,561

(22) Filed: Sep. 16, 1999

(51) Int. Cl.$^7$ .............................. G11C 8/00; G11C 11/00
(52) U.S. Cl. ................................ 365/230.05; 365/154
(58) Field of Search ........................ 365/230.05, 154, 365/156

(56) References Cited

U.S. PATENT DOCUMENTS

| | | |
|---|---|---|
| 4,910,712 | 3/1990 | Camarota et al. . |
| 4,975,877 | 12/1990 | Bell ................................. 365/189.01 |
| 5,477,489 | * 12/1995 | Wiedmann ....................... 365/189.04 |
| 5,959,931 | * 9/1999 | Ueda ................................ 365/230.05 |
| 6,026,012 | * 2/2000 | Hsue .................................... 365/154 |

* cited by examiner

*Primary Examiner*—Richard Elms
*Assistant Examiner*—Anh Phung
(74) *Attorney, Agent, or Firm*—Carr & Ferrell LLP (57) ABSTRACT

RAM cells having a substantially balanced number of N-MOS and P-MOS transistors are disclosed. In a two-port RAM cell the invention uses an N read-write port comprising N-MOS transistors and a P read-port comprising P-MOS transistors. In a three-port RAM cell having one read-write port, the invention adds another N read-port comprising N-MOS transistors to the same two-port RAM cell. In effect, for each read-port added to a RAM cell, the invention alternates between a P read-port and then an N read-port. In a RAM cell having multiple N read-write-ports and multiple read-ports, the invention selects the number of P read-ports and/or the number of N read-ports such that the number of N-MOS transistors in the RAM cell are substantially the same as the number of P-MOS transistors. The invention is thus advantageous over the prior art because the invention provides a more balanced number of N-MOS and P-MOS transistors in each RAM cell, which better utilizes the layout areas. In accordance with the invention, using an N-read port to read data from a RAM cell pre-charges the corresponding bit lines to a high logic state. Conversely, using a P read-port to read data pre-charges the bit lines to a low logic state.

13 Claims, 10 Drawing Sheets

| 1: NWELL | 3: PPLUS | 8: CONT | 10: VIA1 |
| 2: NPLUS | 5: POLY | 9: M1 | 39: LABEL |

FIG. 7B

RAM CELLS HAVING A SUBSTANTIALLY BALANCED NUMBER OF N-MOS AND P-MOS TRANSISTORS FOR IMPROVING LAYOUT AREAS

BACKGROUND OF THE INVENTION

1. Field of the Invention

The present invention relates generally to Complementary Metal-Oxide-Semiconductor Random Access Memories (CMOS RAMs), and more particularly to using a balanced number of N-MOS and P-MOS transistors in a RAM cell to save layout area.

2. Description of the Background Art

CMOS RAM cells comprise N-MOS and P-MOS type transistors, each type of which requires layout areas separate from the other type.

Figure 1:
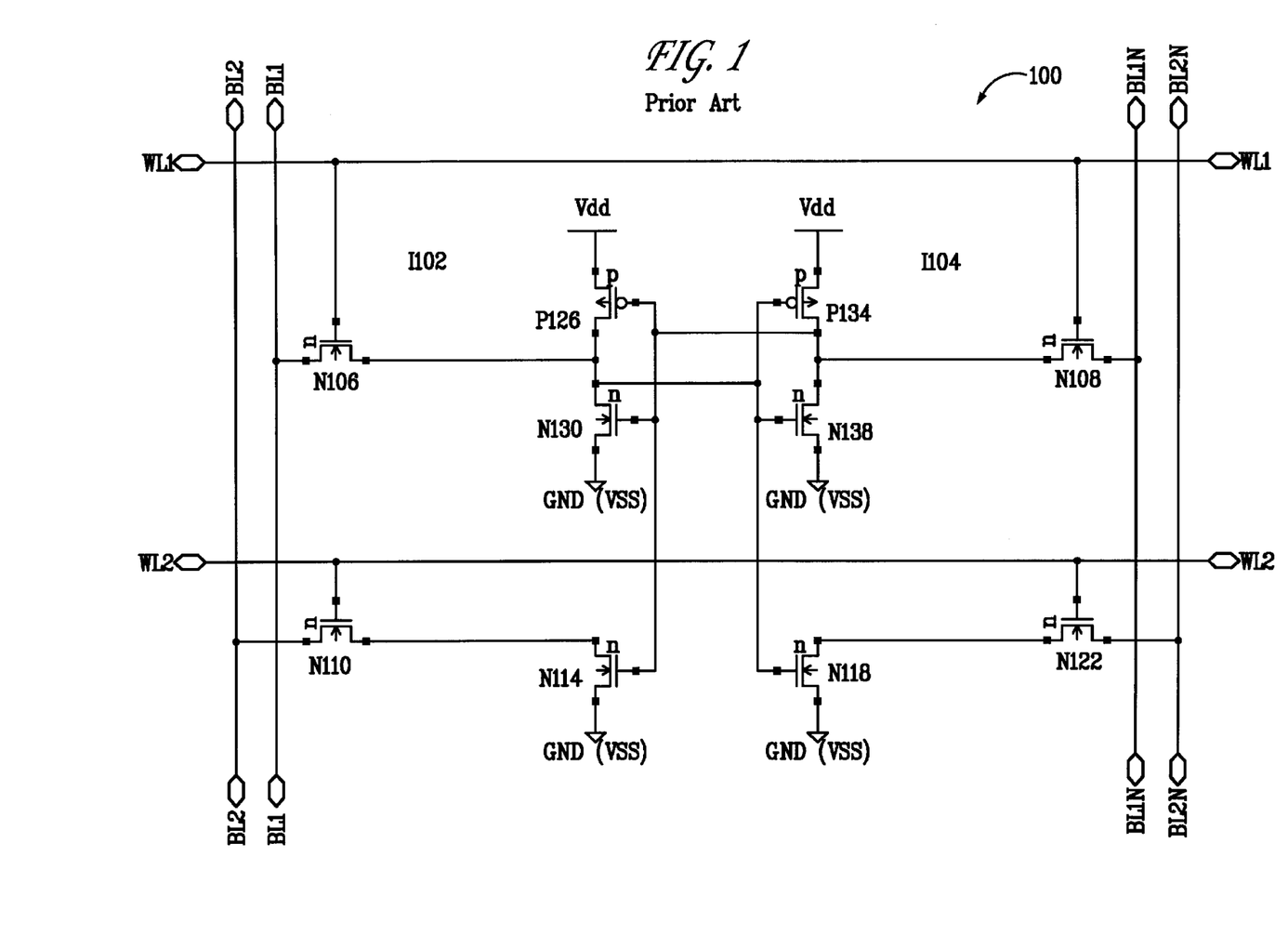
FIG. 1 is a circuit diagram of a prior art two-port RAM cell.

FIG. 1 shows a prior art two-port RAM cell 100 that includes two P-MOS transistors P126 and P134 and eight N-MOS transistors N106, N130, N138, N108, N110, N114, N118, and N122. Transistors P126 and N130 form an inverter I102 while transistors P134 and N138 form an inverter I104. The two inverters I102 and I104 are "cross-coupled," that is, the output of inverter I102 is connected to the input of inverter I104 and the output of inverter I104 is connected to the input of inverter I102.

Lines BL1, BL2, BL1N, and BL2N are referred to as "bit lines."

Line WL1, together with transistors N106, N130, N138, and N108, is referred to as a read-write port since line WL1 enables both reading from and writing to RAM cell 100. Line WL2, together with transistors N110, N114, N118, and N122, is referred to as a read-port because line WL2 enables only reading from RAM cell 100. Lines WL1 and WL2 are also referred to as "word lines."

RAM cell 100 has significantly fewer P-MOS transistors than N-MOS transistors, i.e., two P-MOS transistors P126 and P134 versus eight N-MOS transistors N106, N130, N138, N108, N110, N114, N118, and N122. As the number of ports in RAM cell 100 increases, the unbalance between the number of P-MOS and N-MOS transistors increases.

Figure 2:
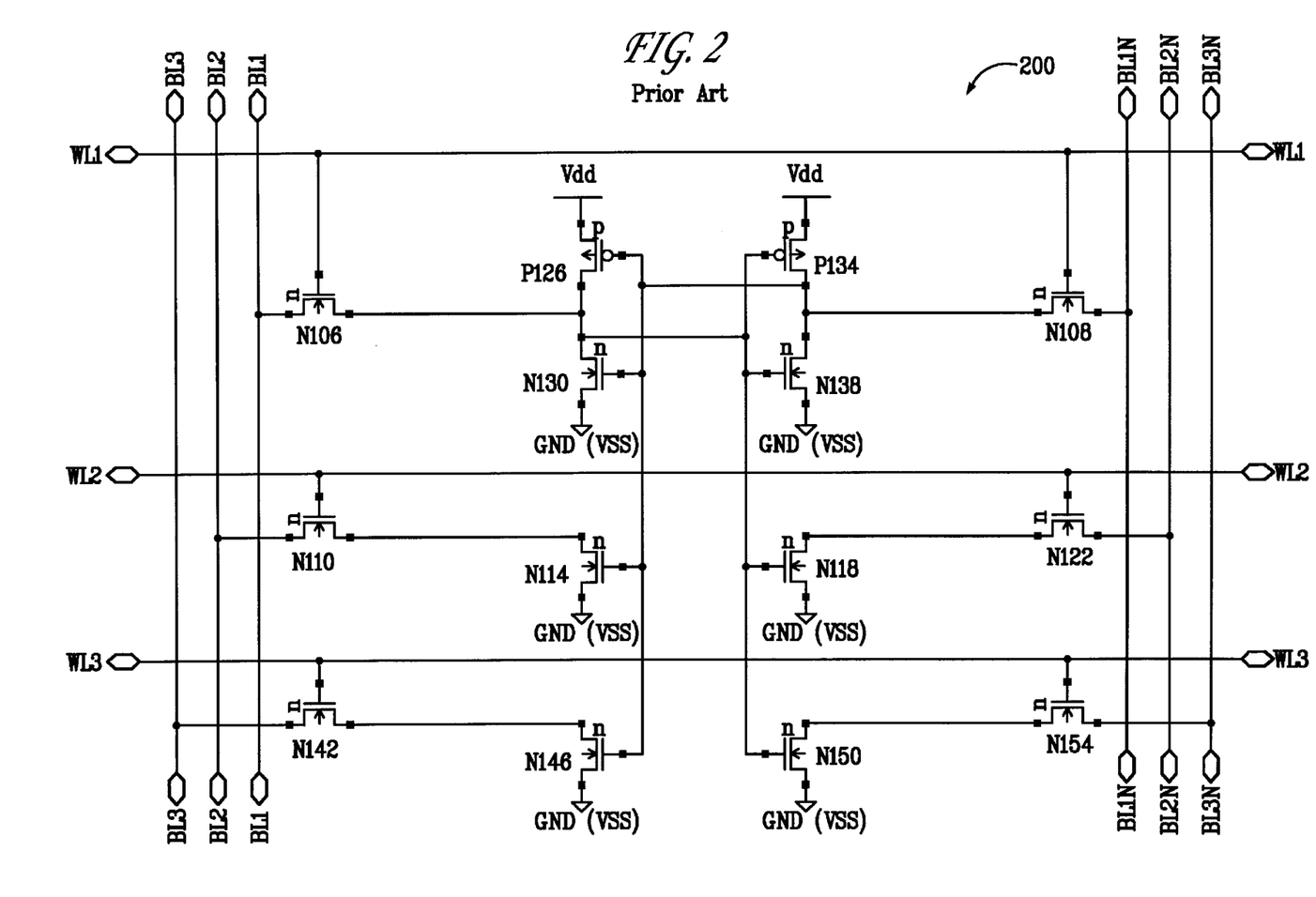
FIG. 2 is a circuit diagram of a prior art three-port RAM cell.

FIG. 2 shows a prior art three-port RAM cell 200, which is equivalent to RAM cell 100 with a second read-port WL3 constituted by the four N-MOS transistors N142, N146, N150, and N154. RAM cell 200 thus has two P-MOS transistors P126 and P134 and 12 N-MOS transistors N106, N130, N138, N108, N110, N114, N118, N122, N142, N146, N150, and N154. The ratio of P-MOS transistors to N-MOS transistors of ¼ in cell 100 decreases to ⅙ in cell 200. Because the ports are constituted by N-MOS transistors, this ratio continues to decrease as the number of ports increases. Consequently, since the layout areas for a P-MOS transistor and for an N-MOS transistor must be separated by at least the minimum distance specified by the layout design rules, the unbalanced number of P-MOS and N-MOS transistors wastes layout area.

Figure 3A:
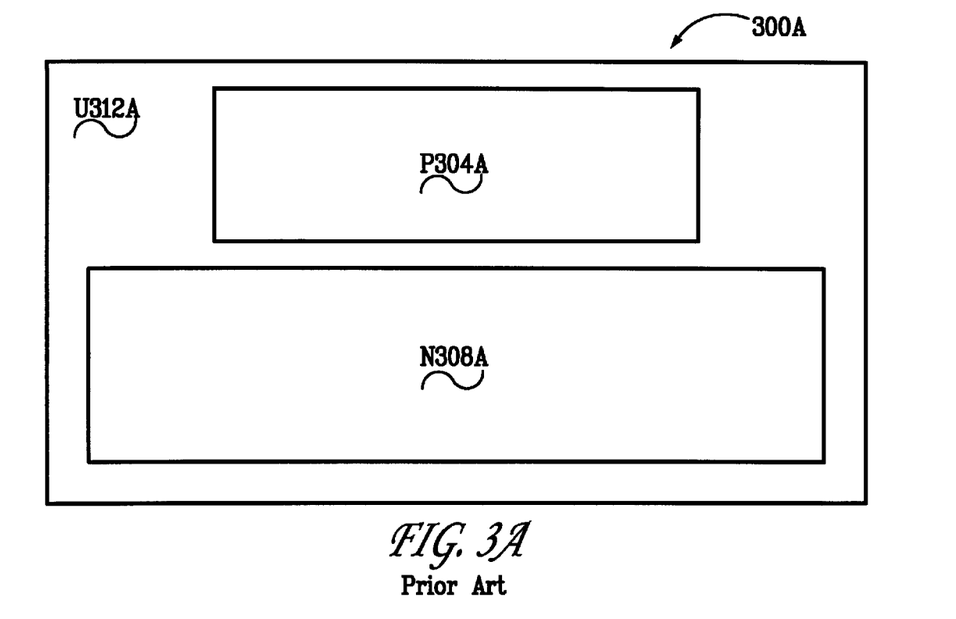
FIG. 3A shows a first exemplary layout as used in the circuit of FIG. 1 or FIG. 2.
Figure 3B:
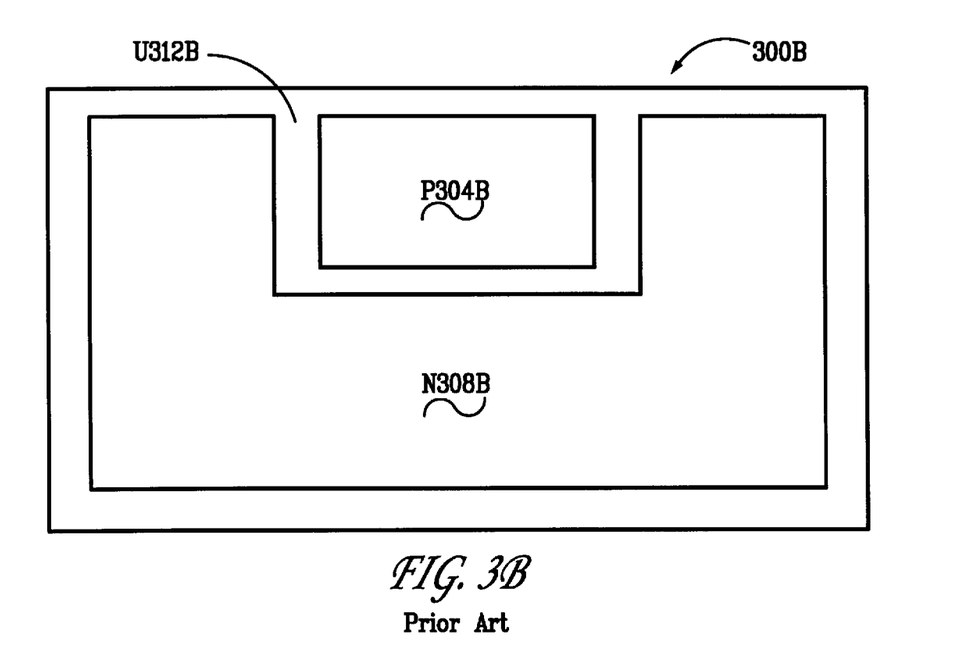
FIG. 3B shows a second exemplary layout as used in the circuit of FIG. 1 or FIG. 2.

FIGS. 3A and 3B show two prior art layouts 300A and 300B for either RAM cell 100 or 200. Layouts 300A and 300B each include areas P304 for P-MOS transistors, areas N308 for N-MOS transistors, and unused areas U312. The suffixes A and B correspond to layouts 300A and 300B, respectively. Unused areas U312 are wasted and should be minimized. Even though layout 300B is preferable to layout 300A because the unused area U312B is smaller than the unused area U312A, both unused areas U312A and U312B increase the total layout area. Possibilities for reducing unused areas U312 while providing the same RAM cell circuit are limited because layout design rules require a minimum spacing between area P304 and area N308 to separate P-MOS transistors from N-MOS transistors. The typical spacing requirement is 2.4 $\mu$m for 0.35 $\mu$m technology where 0.35 $\mu$m denotes the minimum manufacturable transistor gate length of the technology.

What is needed, therefore, is a method for improving the deficient layout schemes of the prior art, while maintaining circuit functionalities.

SUMMARY OF THE INVENTION

The present invention provides RAM cells having a substantially balanced number of N-MOS and P-MOS transistors to utilize layout resources. A port in the preferred embodiment is referred to as an N-port if it comprises four N-MOS transistors, and is referred to as a P-port if it comprises four P-MOS transistors. Further, read-write ports are of the same type, i.e., either an N-type or a P-type, while read-ports may be mixed. In a two-port RAM cell having one read-write port, the invention uses an N-read-write port and a P read-port. To form a three-port RAM cell comprising a read-write port and two read-ports, the invention uses an N read-write port, a P read-port, and an N read-port. In effect, the invention adds a second N read-port to the above-described two-port RAM cell to form the three-port RAM cell. To form a RAM cell having additional read-ports, the invention alternately adds a P-port and then an N-port to the RAM cell.

In a RAM cell having multiple N-read-write ports and multiple read-ports, the invention selects the number of P read-ports and the number of N read-ports such that the number of N-MOS transistors in the cell is as close as the number of P-MOS transistors as practical. For example, in a five-port RAM cell having three N read-write ports and two read-ports, the invention uses two P read-ports, which results in eight N-MOS transistors and eight P-MOS transistors. Similarly, in a six-port RAM cell having three N-read-write ports and three read-ports the invention uses P-ports for all three read-ports, which results in eight N-MOS transistors and ten P-MOS transistors. Using one N read-port and two P read-ports would result in twelve N-MOS transistors and eight P-MOS transistors.

In accordance with the invention, using an N-port to read data from the RAM cell pre-charges the corresponding bit lines to a high logic level. Conversely, using a P-port to read data from the RAM cell pre-charges the corresponding bit lines to a low logic level.

DETAIL DESCRIPTION OF THE PREFERRED EMBODIMENT

The present invention provides a method for designing RAM cells having a substantially balanced number of N-MOS and P-MOS transistors so that the circuit layout area can be better utilized than in the prior art.

Figure 4:
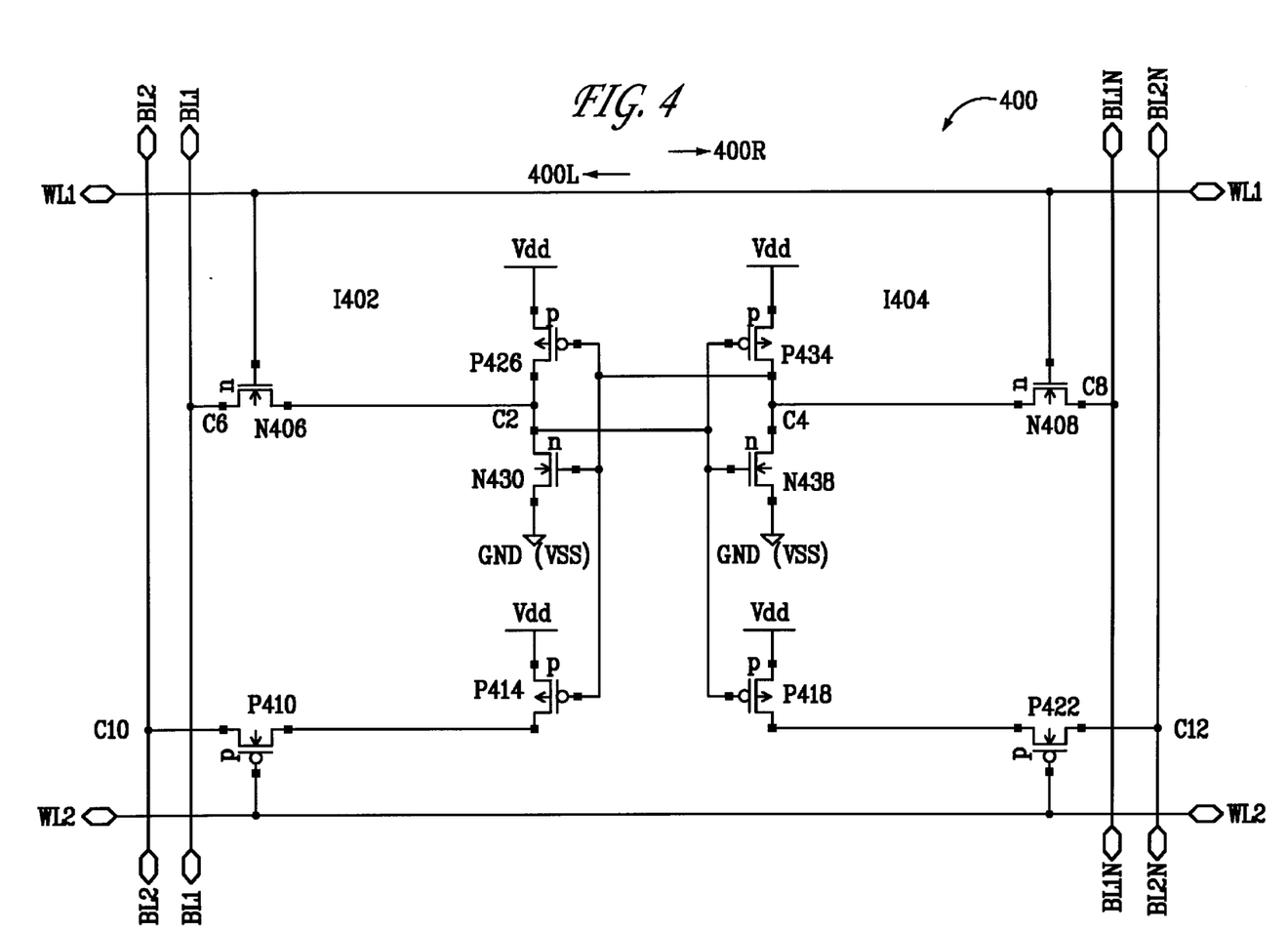
FIG. 4 is a circuit diagram of a two-port RAM cell in accordance with the invention.

FIG. 4 shows a two-port RAM cell 400 in accordance with the invention. RAM cell 400 includes cross-coupled inverters I402 and I404, two N-MOS gating transistors N406 and N408, and four P-MOS transistors P410, P414, P418, and P422. Inverter I402 includes a P-MOS transistor P426 and an N-MOS transistor N430. Inverter I404 includes a P-MOS transistor P434 and an N-MOS transistor N438. Inverters I402 and I404 and the two gating transistors N406 and N408 are comparable to inverters I102 and I104 and the two gating transistors N106 and N108 of FIG. 1.

The four N-MOS transistors N406, N430, N438, and N408 constitute a read-write port on line WL1. The four P-MOS transistors P410, P414, P418, and P422 constitute a read-port on line WL2. In the preferred embodiment, the term N-port indicates a port having four N-MOS transistors while the term P-port indicates a port having four P-MOS transistors. In accordance with the invention, read-write ports are of one type, e.g., either an N-type or a P-type, while read-ports may be mixed. Ports WL1 and WL2 are also referred to as word lines WL1 and WL2 respectively. Lines BL1, BL1N, BL2, and BL2N are also referred to as bit lines.

RAM cell 400 includes two symmetrical sections 400L and 400R which include inverter I402, transistors N406, P410, P414, and lines BL1 and BL2; and inverter I404, transistors N408, P418, P422, and lines BL1N and BL2N, respectively. Because section 400L operates in the same manner as section 400R, an explanation of the operation of section 400L is applicable to the operation of section 400R, and vice-versa.

In accordance with the invention, the logic state at node C2 of inverter I402 is the inverse of the logic state at node C4 of inverter I404, i.e., if node C2 is in the logic state 1("high"), then node C4 is in the logic state 0 ("low"), and vice-versa. Further, if node C2 is high, then transistors P418 and P434 are "off" while transistors P426 and P 414 are "on."

In the preferred embodiment, when line WL1 is high, transistors N406 and N408 are on, and when line WL1 is low, transistors N406 and N408 are off. Conversely, when line WL2 is low, transistors P410 and P422 are on, and when line WL2 is high, transistors P410 and P422 are off.

Further, using an N-port to read data from cell 400 pre-charges the corresponding bit lines (e.g., BL1, BL1N for WL1 and BL2 and BL2N for WL2) to a logic high while using a P-port to read data from cell 400 pre-charges the corresponding bit lines to a logic low. In addition, the invention uses an N-port to read a low and uses a P-port to read a high. For example, using N-port WL1 to read data from cell 400 pre-charges lines BL1 and BL1N to a logic high, which causes nodes C6 and C8 to be high. If node C2 is low, then transistor N438 is off and transistor N430 is on. When WL1 is high, which turns transistor N406 on, a current flows from node C6 through transistors N406 and N430 to ground (or VSS). As a result, the voltage level at node C6 is lower than that at node C8, and this differential signal is used to trigger a read. Because node C2 is, as assumed, low, node C4 is high.

Conversely, if node C2 is high and line WL1 is high, then current flows from node C8 through transistors N408 and N438 to ground, which causes the voltage level at node C8 to be lower than that at node C6, which in turn triggers a read high at node C2, and thus a read low at node C4. Consequently, when a read is triggered, the invention, with proper setups, can read the data from nodes C2 and C4 accordingly.

In the preferred embodiment, the invention reads a low at node C2, and if node C2 is low then the condition as explained above exists; the invention thus reads the low data at node C2 and the high data at node C4. However, if the condition is not satisfied, which indicates that C2 is high, then the invention reads the high data at node C2 and the low data at node C4.

In accordance with the invention, using P-port WL2 to read data from cell 400 pre-charges lines BL2 and BL2N to a logic low, which causes nodes C10 and C12 to be low. If node C2 is low then transistor P418 is on and transistor P414 is off. When line WL2 is low, which turns transistor P422 on, a current flows from Vdd through transistors P418 and P422 to node C12. As a result, the voltage level at node C12 is higher than that at node C10, and this differential signal triggers a read. Because node C2 is, as assumed, low, node C4 is high. Consequently, when a read is triggered, the invention can read the data from nodes C2 and C4 accordingly.

Writing to cell 400 preferably places the to-be-written data at node C6 and/or the inverse of that data at node C8. Activating line WL1 forces the data at node C2 to flip to the logic level represented at node C6. Thus, for example, writing a high drives node C6 to a logic high and node C8 to a logic low. Conversely, writing a low preferably drives node C6 to a low and node C8 to a high. In the preferred embodiment, the invention writes a low to either node C2 or C4, and a high automatically follows at node C4 or C2 respectively. For example, writing a low to node C2 results in writing a high to node C4 and writing a low to node C4 results in writing a high to node C2.

Figure 5A:
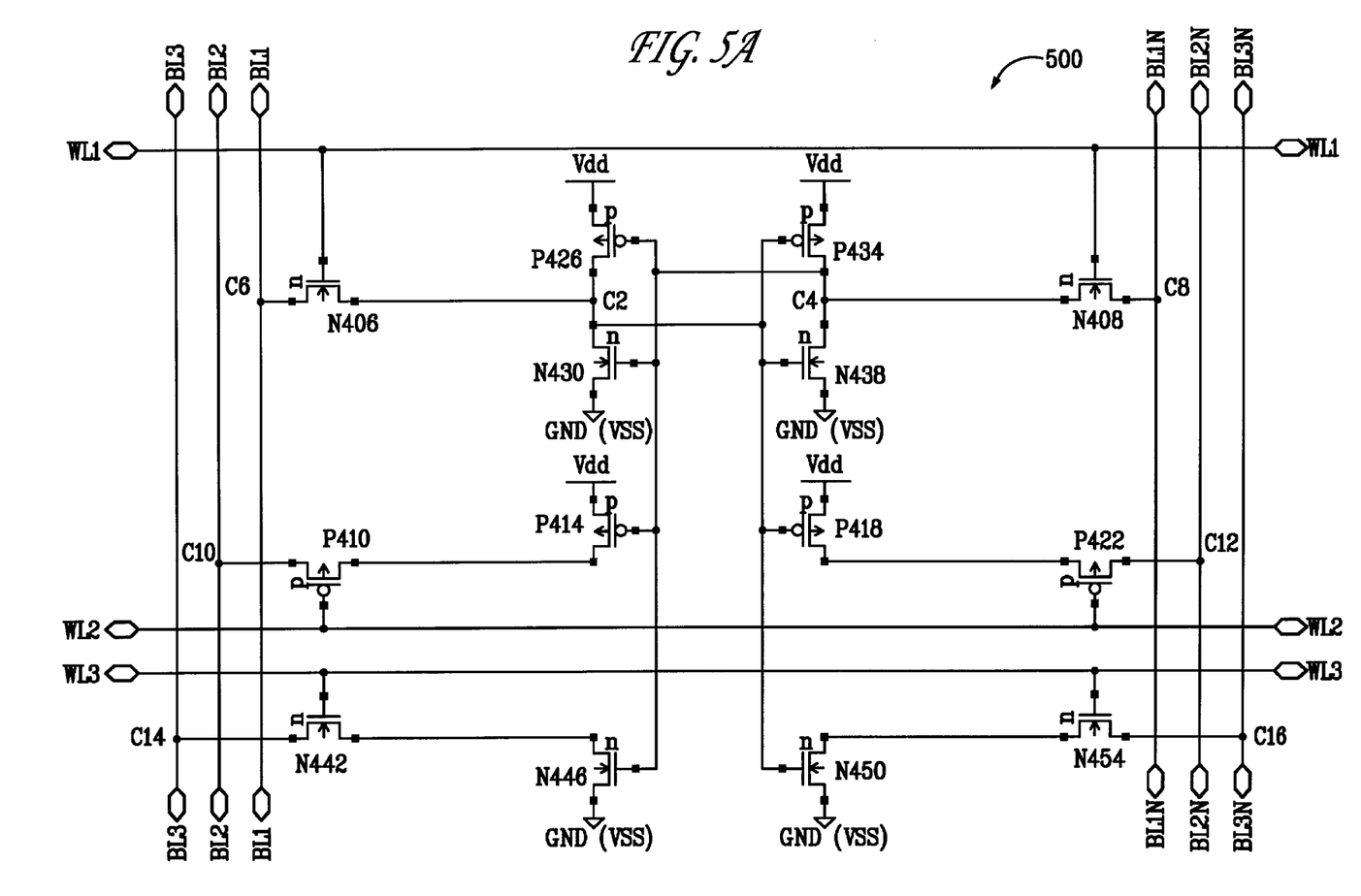
FIG. 5A is a circuit diagram of a three-port RAM cell having one read-write port and two read-ports in accordance with the invention.

FIG. 5A shows a 3-port RAM cell 500 having one read-write port and two read-ports in accordance with the invention. RAM cell 500 is equivalent to RAM cell 400 with an additional N-port WL3 having four transistors N442, N446, N450, and N454. N-port WL3 is a read-port and operates in the same manner as read-write port WL1 when used for reading. As such, lines WL3, BL3 and BL3N; nodes C14 and C16; and transistors N442, N446, N450, and N454 correspond to lines WL1, BL1 and BL1N; nodes C6 and C8; and transistors N406, N430, N438, and N408 of FIG. 4, respectively.

The invention, to provide a RAM cell having additional read ports, alternately adds a P-port and then an N-port to RAM cell 500. Four additional P-MOS transistors coupled in the same manner as four transistors P410, P414, P418, and P422 may constitute an additional read-port. However, the preferred embodiment uses only two additional P-MOS transistors in the same manner as two transistors P410 and P422 to work with two transistors P414 and P418 to constitute an additional read-port. Similarly, four N-MOS transistors coupled in the same manner as four transistors N442, N446, N450, and N454 may constitute an additional N read-port, but the preferred embodiment uses only two N-MOS transistors in the same manner as two transistors N442 and N454 to work with transistors N446 and N450 to constitute an additional N read-port. To form a 4-port RAM cell 500A (not shown), for example, the invention adds a P-port to cell 500; to form a 5-port RAM cell 500B (not shown), the invention adds an N-port to cell 500A; to form a 6-port RAM cell 500C (not shown), the invention adds a P-port to cell 500B, etc. Alternately adding a P-port and then an N-port provides a RAM cell having a more balanced number of P-MOS and N-MOS transistors. Consequently, the invention is advantageous over prior art layouts that have all N-read ports, which result in a disproportionate number of P-MOS and N-MOS transistors, and thus a larger layout space.

Figure 5B:
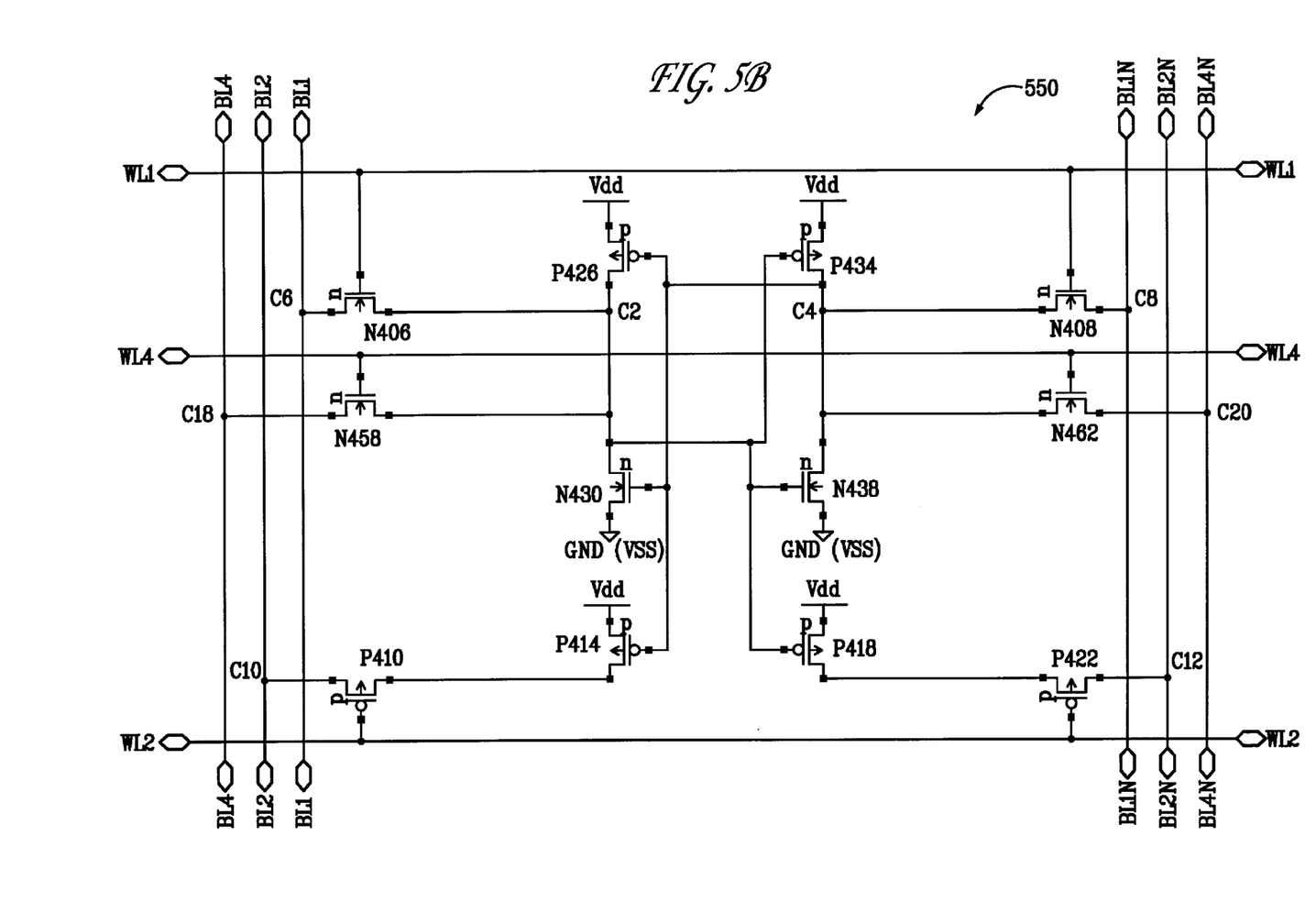
FIG. 5B is a circuit diagram of a three-port RAM cell having two read-write ports and one read-port in accordance with the invention.

FIG. 5B shows a 3-port RAM cell 550 having two read-write ports and one read-port in accordance with the invention. RAM cell 550 is equivalent to RAM cell 400 with an additional N read-write port WL4 that comprises two additional transistors N458 and N462 and two existing transistors N430 and N438, and operates in the same manner as N read-write port WL1. Consequently, lines WL4, BL4, and BL1N; nodes C18 and C20; and transistors N458 and N462 correspond to lines WL1, BL1 and BL1N; nodes C6 and C8; and transistors N406 and N408 of FIG. 4, respectively. An alternative embodiment, instead of using two transistors N458 and N462, may use four N-MOS transistors in the same manner as four transistors N406, N430, N438, and N408 to form an additional read-write port.

Because read-write ports in a RAM cell in accordance with the invention are of the same type (e.g., N-type), the invention, to form each additional read-write port, adds two N-MOS transistors, two bit lines, and a word line in the same manner as adding two N-MOS transistors N458 and N462, two bit lines BL4 and BL4N, and word line WL4 to form port WL4. As read-ports are added, the invention balances the number of N-MOS and P-MOS transistors in the RAM cell as a whole, that is, the invention selects the number of P read-ports and/or N read-ports such that the number of N-MOS transistors in the RAM cell is as close as practical as the number of P-MOS transistors. The invention uses the following equations to calculate the number of N-MOS and P-MOS transistors in the RAM cell.

If $P_{rwn}$ denotes the number of N read-write ports, $P_{rn}$ denotes the number of N read-ports and $P_{rp}$ denotes the number of P read-ports, then the number $T_{rwn}$ of N-MOS transistors for the N read-write ports, the number $T_{rn}$ of N-MOS transistors for the N read-ports, and the number $T_{rp}$ of P-MOS transistors for the P read-ports are respectively as follows:

$$T_{rwn}=4+2*(P_{rwn}-1)$$

$$T_{rn}=4+2*(P_{rn}-1)$$

$$T_{rp}=4+2*(P_{rp}-1)$$

The alternative embodiment that utilizes four transistors to constitute each port uses:

$$T_{rwn}=4*P_{rwn}$$

$$T_{rn}=4*P_{rn}$$

$$T_{rp}=4*P_{rp}$$

Thus, $T_n$, the number of N-MOS transistors in the RAM cell is $$T_n=T_{rwn}+T_{rn}$$

and the number of P-MOS transistors in the RAM cell is:

$$T_p=T_{rp}+2$$

Consequently, for example, in a 5-port RAM cell having three N read-write ports and two read-ports the invention uses two P read ports, which results in 8 (=4+2*(3−1)) N-MOS transistors and 8 (=2+4+2*(2−1)) P-MOS transistors. Similarly, in a 6-port RAM cell having four N read-write ports and two read-ports, the invention uses two P-read-ports, which results in ten N-MOS transistors and eight P-MOS transistors. Similarly, in a 6-port RAM cell having three N read-write ports and three read-ports, the invention uses all three P read-ports, which results in eight N-MOS transistors and ten P-MOS transistors. Using one N read-port and two P read-ports would result in twelve N-MOS transistors and eight P-MOS transistors. As the number of N-MOS and P-MOS transistors used in existing ports have been substantially balanced, the invention alternately adds a P read-port and then an N read-port as described above with reference to FIG. 5A.

Figure 6A:
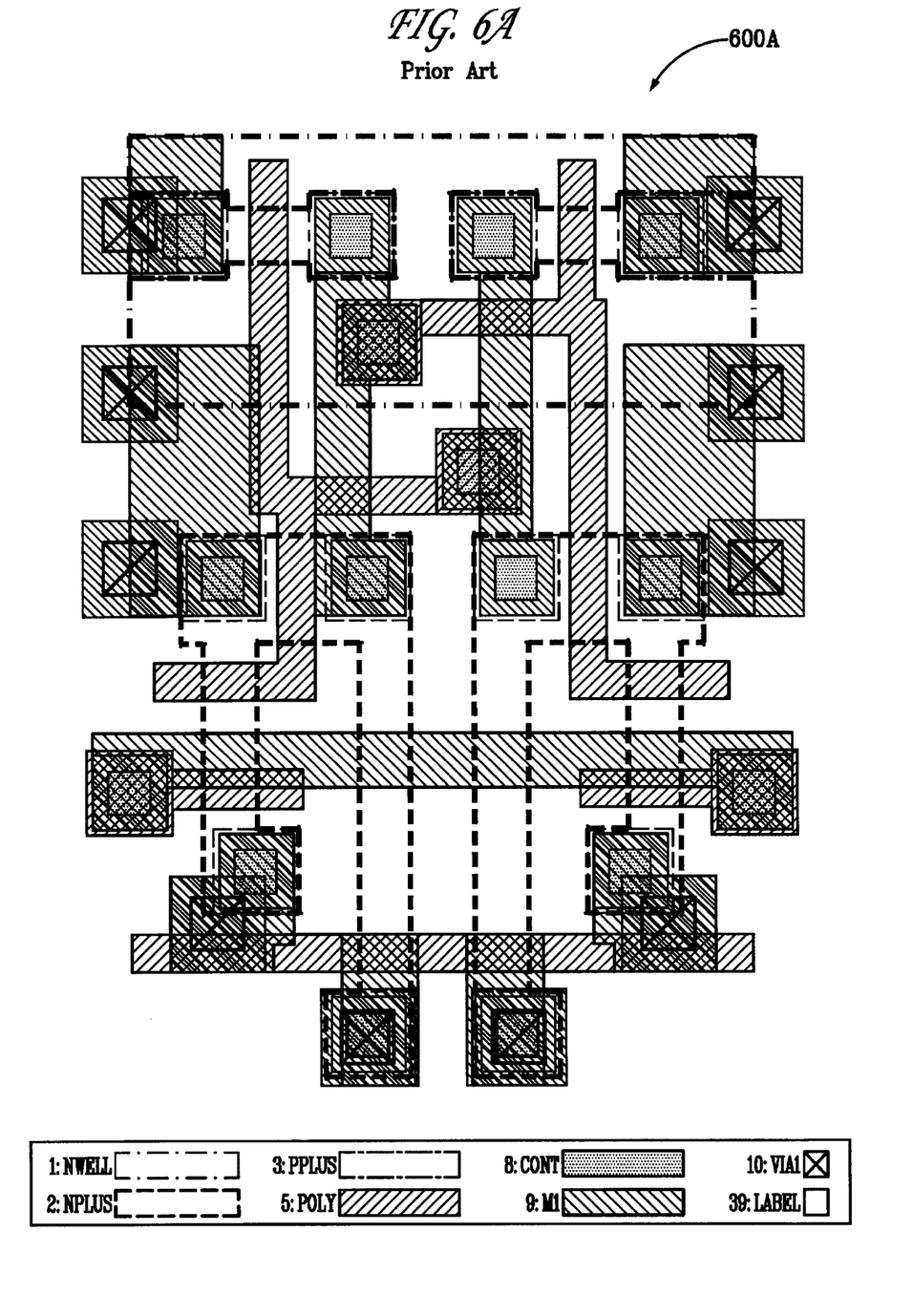
FIG. 6A shows a layout of the prior art RAM cell of FIG. 1.
Figure 6B:
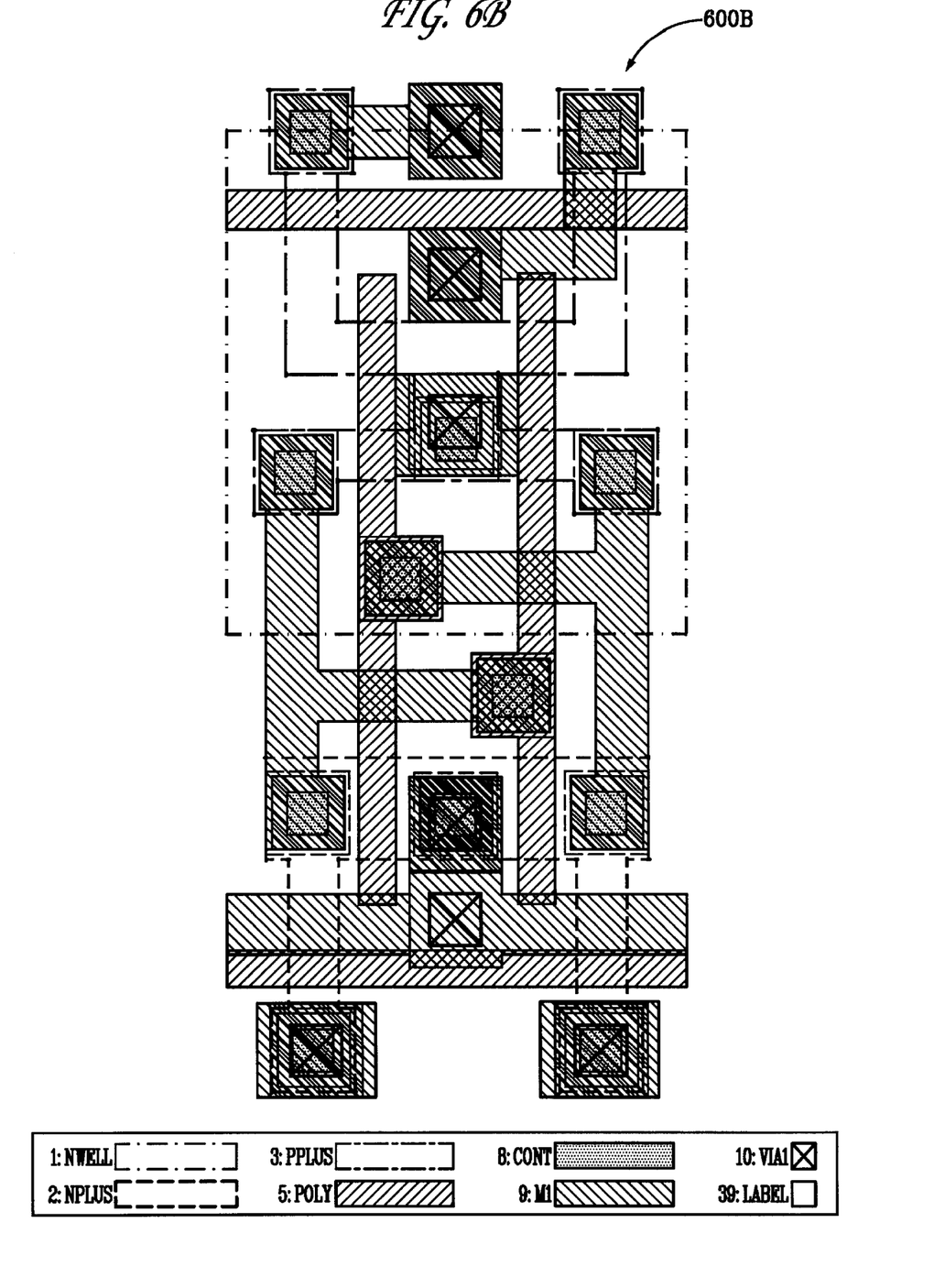
FIG. 6B shows a layout of the RAM cell of FIG. 4.

FIGS. 6A and 6B are two layouts 600A and 600B that correspond respectively to FIG. 1 RAM cell 100 in accordance with the prior art and FIG. 4 RAM cell 400 in accordance with the invention. Layouts 600A and 600B were plotted employing design rules used by Rosun Technology, Inc. of Fremont, Calif. Layout 600A requires a layout area of 5.85 $\mu$m*8.45 $\mu$m (=49.4352 $\mu$m$^2$) while layout 600B requires a layout area of 4.45 $\mu$m*8.95 $\mu$m (=39.8275 $\mu$m$^2$), which is an improvement of about 20%.

Figure 7A:
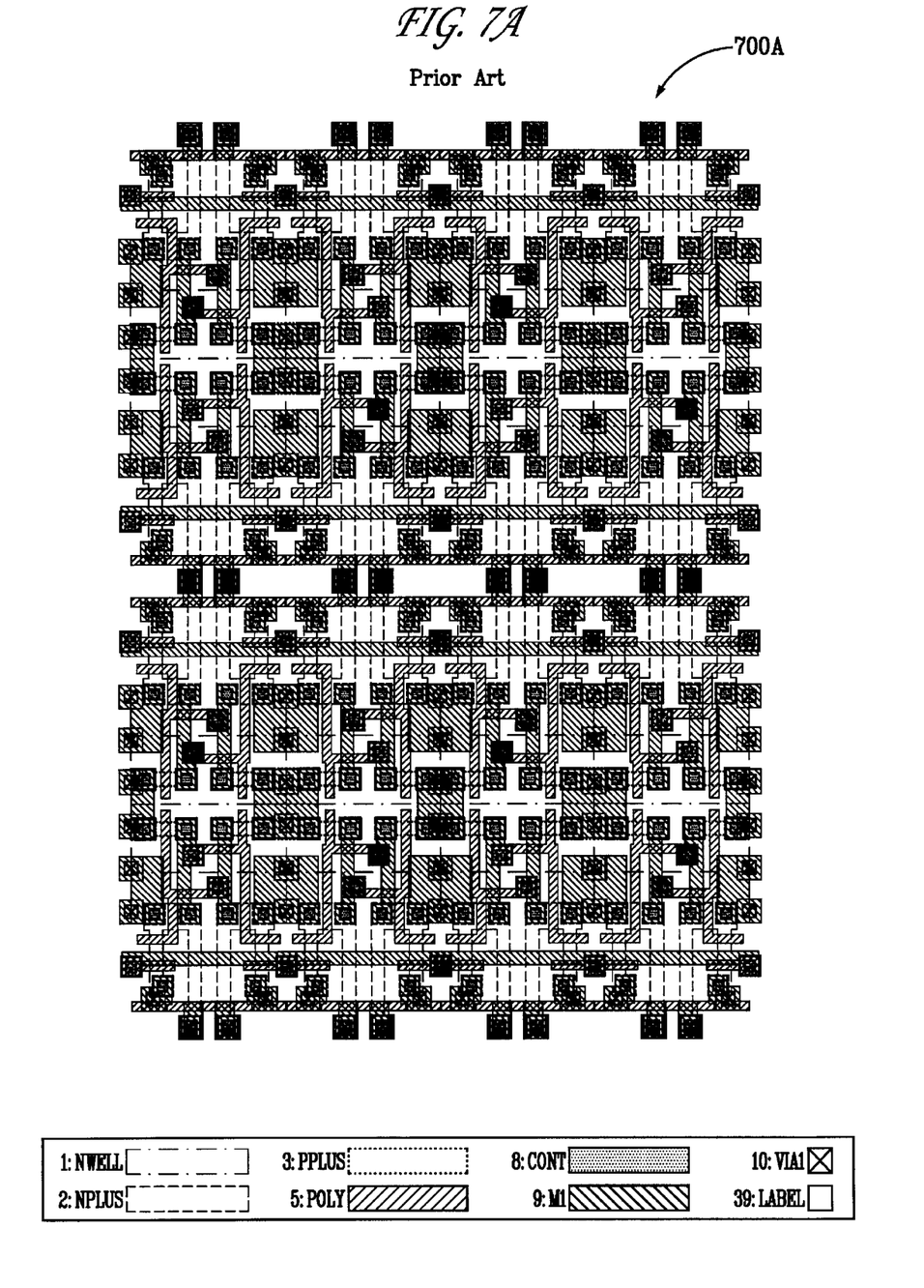
FIG. 7A shows a layout of a 4×4 array that uses the prior art RAM cells of FIG. 1.
Figure 7B:
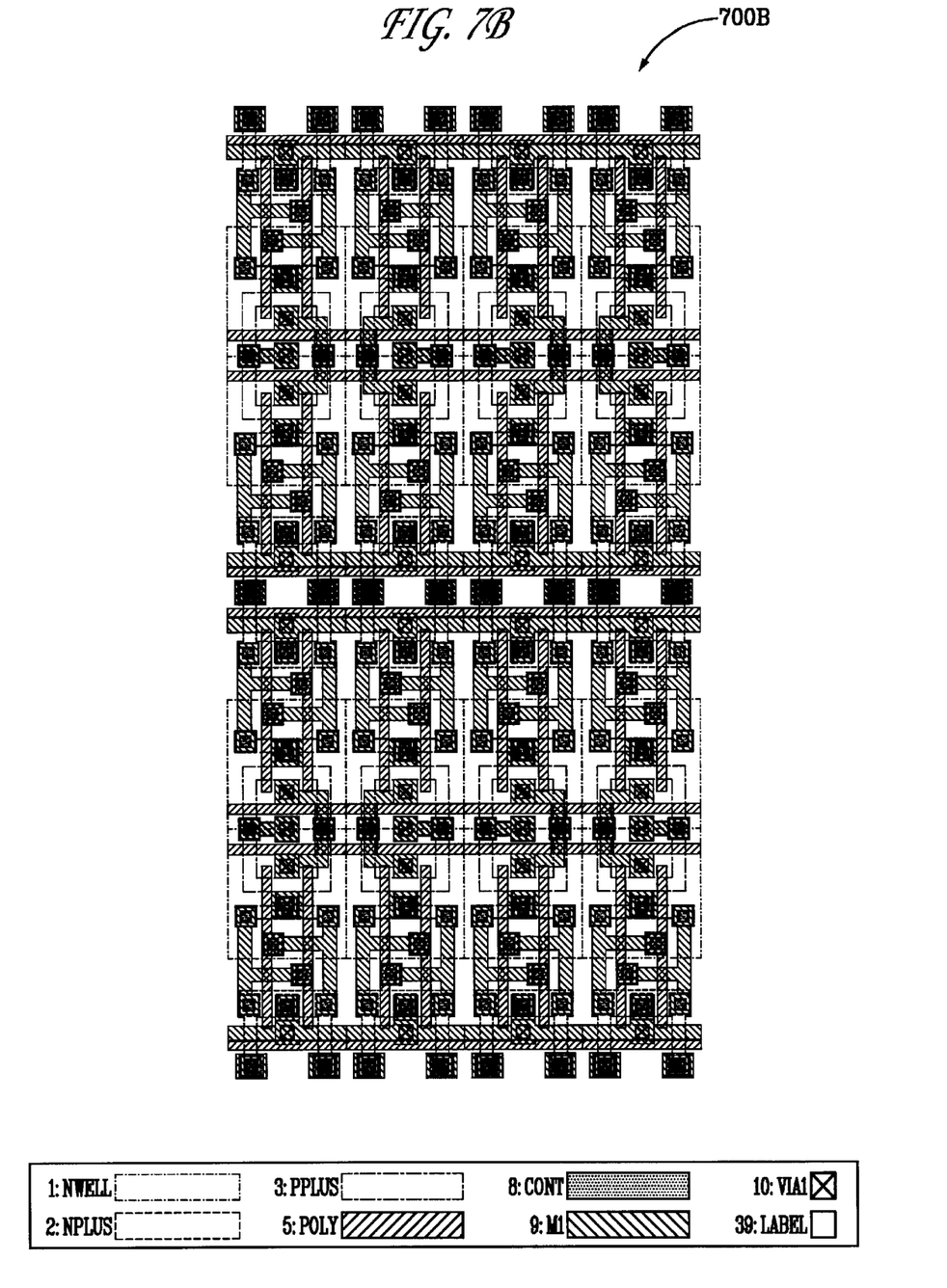
FIG. 7B shows a layout of a 4×4 array that uses the inventive RAM cells of FIG. 4.

FIGS. 7A and 7B are two layouts 700A and 700B of a 4×4 array using 2-port RAM cells. Layout 700A corresponds to a prior art technique which uses RAM cells 100 while layout 700B corresponds to the invention which uses RAM cells 400 for the array. Layout 700A requires an area of 23.4 $\mu$m*33.8 $\mu$m (=790.92 $\mu$m$^2$) while layout 700B requires an area of 17.8 $\mu$m* 35.8 $\mu$m (=637.24 $\mu$m$^2$), which is an improvement of 20%.

For illustrative purposes, only layers NWELL, NPLUS, PPLUS, POLY, CONT, M1, and VIA in FIGS. 6A, 6B, 7A, and 7B have been plotted here. Those skilled in the art will recognize that layers NPLUS, PPLUS, and M1 may commonly be referred to as layers N-diffusion, P-diffusion, and Metal One, respectively.

The invention has been explained above with reference to two preferred embodiments. Other embodiments will be apparent to those skilled in the art in view of this disclosure. For example, in FIGS. 4, 5A, and 5B, N-MOS transistors may replace P-MOS transistors and P-MOS transistors may replace N-MOS transistors. Further, the invention may be used in a dynamic RAM (DRAM) cell in which two P-MOS transistors P426 and P434 may be substituted by a refresh circuit. Therefore, these and other variations upon the preferred embodiment are intended to be covered by the following claims.

What is claimed is:

1. A memory structure comprising:
   at least one first-conductivity type port;
   at least one second-conductivity type port;
   a node for storing data;
   at least one read-write port being of said first-conductivity type port and including a read-write word line coupled to a pair of read-write bit lines, for writing said data to, and reading said data from, said node; and
   at least one read-port including a read word line coupled to a pair of read bit lines, for reading said data from said node;

wherein transistors in said memory structure including transistors in said at least one read-write port and in said at least one read-port constitute a first number $T_n$ of transistors of said first type of conductivity and a second number $T_p$ of transistors of said second type of conductivity, said number $T_n$ substantially equals said number $T_p$.

2. The memory structure of claim 1 wherein:

if said first type of conductivity constitutes N-MOS, then said second type of conductivity constitutes P-MOS;

else if said first type of conductivity constitutes P-MOS, then said second type of conductivity constitutes N-MOS.

3. The memory structure of claim 1 wherein:

a first logic state used to pre-charge said first-conductivity type port is a high logic state; and a second logic state used to pre-charge said second-conductivity type port is a low logic state.

4. The memory structure of claim 1 wherein:

if a number $P_t$ constituting the total ports in said memory structure is an even number then a number $P_n$ constituting said at least one first-conductivity type port equals a number $P_p$ constituting said at least one second-conductivity type port;

else if said number $P_t$ is an odd number then said number $P_n$ is greater than said number $P_p$ by one.

5. The memory structure of claim 1 wherein if said at least one first-conductivity type port is constituted by N-MOS transistors then said at least one second-conductivity type port is constituted by P-MOS transistors;

else if said at least one first-conductivity type port is constituted by P-MOS transistors then said at least one second-conductivity type port is constituted by N-MOS transistors.

6. The memory structure of claim 1 wherein said at least one read-port is selected from a combination of said at least one first-conductivity type port and said at least one second-conductivity type port.

7. The memory structure of claim 1 wherein:

if $P_{rwn}$ denotes a number constituting said at least one read-write port, $T_{rwn}$ denotes a number of transistors constituting said $P_{rwn}$ read-write port, then said number $T_{rwn}$ is selected from a group consisting of $T_{rwn1}$ and $T_{rwn2}$ where $T_{rwn1}=4+2*(P_{rwn}-1)$ and $T_{rwn2}=4*P_{rwn}$;

if $P_{rn}$ denotes a number constituting read-ports of said first-conductivity type and $T_{rn}$ denotes a number of transistors constituting said $P_{rn}$ read-ports then said number $T_{rn}$ is selected from a group consisting of $T_{rn1}$ and $T_{rn2}$ where $T_{rn1}=4+2*(P_{rn}-1)$ and $T_{rn2}=4* P_{rn}$;

if $T_n$ denotes a number of transistors of said first-type in said memory structure then said number $T_{n=Trwn}+T_{rn}$;

if $P_{rp}$ denotes a number of said second-category read-ports and $T_{rp}$ denotes a number of transistors constituting said $P_{rp}$ read-ports, then said number $T_{rp}$ is selected from a group consisting of $T_{rp1}$ and $T_{rp2}$ where $T_{rp1}=4+2*(P_{rp}-1)$ and $T_{rp2}=4*P_{rp}$;

if $T_p$ denotes a number of transistors of said second-conductivity type in said memory structure then said number $T_p=T_{rp}+2$; and said number $T_p$ is substantially the same as said number $T_n$.

8. The memory structure of claim 1 wherein a number $P_n$ constituting said at least one first-conductivity type port is substantially the same as a number $P_p$ constituting said at least one second-conductivity type port.

9. A memory circuit comprising:

a first inverter;

a second inverter cross-coupled to said first inverter;

a first transistor coupled to said first inverter;

a second transistor coupled to said second inverter; and a first read-port coupled to said cross-coupled inverters; wherein said first transistor, said second transistor, and a plurality of transistors in said cross-coupled inverters are of a first type and constitute a first read-write port, which is operated by a first logic state at a first pair of read-write bit lines;

said first read-port includes transistors of a second type and is operated by a second logic state at a first pair of read bit lines; and said second logic state is the opposite of said first logic state.

10. The memory circuit of claim 9 further comprising additional first-type transistors constituting at least one additional read-write port.

11. The memory circuit of claim 10 further comprising at least one additional read-port wherein:

each of said at least one additional read-port having transistors selected from a group consisting of said first-type and said second-type; and a number of transistors of said first-type in said circuit is substantially the same as a number of transistors of said second-type in said circuit.

12. The memory circuit of claim 9 further comprising a second read-port coupled to said cross-coupled inverters and having transistors of said first type.

13. The memory circuit of claim 9 wherein if said first-type constitutes N-MOS then said second-type constitutes P-MOS;

else if said first-type constitute P-MOS then said second-type constitute N-MOS.

* * * * *